United States Patent [19]

Kang et al.

[11] Patent Number: 5,296,189

[45] Date of Patent: Mar. 22, 1994

[54] METHOD FOR PRODUCING METAL POWDER WITH A UNIFORM DISTRIBUTION OF DISPERSANTS, METHOD OF USES THEREOF AND STRUCTURES FABRICATED THEREWITH

[75] Inventors: Sung K. Kang, Chappaqua; Sampath Purushothaman, Yorktown Heights; John J. Ritsko, Mount Kisco, all of N.Y.; Jane M. Shaw, Ridgefield, Conn.; Subhash L. Shinde, Croton-on-Hudson, N.Y.

[73] Assignee: International Business Machines Corporation, Armonk, N.Y.

[21] Appl. No.: 874,901

[22] Filed: Apr. 28, 1992

[51] Int. Cl.$^5$ .............................. B22F 7/00
[52] U.S. Cl. ........................ 419/9; 148/411; 252/512; 264/58; 501/11; 419/32; 419/10
[58] Field of Search ............ 419/7, 9, 23, 31, 32, 419/33, 34, 10; 501/17, 55, 60, 11; 75/246; 148/411; 252/512; 264/58

[56] References Cited

U.S. PATENT DOCUMENTS

| | | | |
|---|---|---|---|
| 1,792,262 | 2/1931 | Wilson | 420/477 |
| 3,070,436 | 12/1962 | Triffleman | 419/3 |
| 3,143,789 | 8/1964 | Iler et al. | 75/235 |
| 3,166,416 | 1/1965 | Worn | 419/20 |
| 3,192,042 | 6/1965 | Spacil | 419/19 |
| 3,218,135 | 11/1965 | Alexander et al. | 428/565 |
| 4,090,874 | 5/1978 | Kaufman | 75/246 |
| 4,398,969 | 8/1983 | Melton et al. | 75/235 |
| 4,443,249 | 8/1984 | Weber et al. | 75/352 |
| 4,557,893 | 12/1985 | Jatkar et al. | 419/12 |
| 4,594,181 | 6/1986 | Siuta | 252/512 |
| 4,599,119 | 7/1986 | Ikushima et al. | 148/411 |
| 4,600,604 | 7/1986 | Siuta | 428/403 |
| 4,609,525 | 9/1986 | Schreiner et al. | 419/6 |
| 4,891,059 | 2/1990 | Diamond et al. | 75/356 |

OTHER PUBLICATIONS

Gilman et al., "Mechanical Alloying", Ann. Rev. Mater. Sci., 1983.
R. M. Davis et al., "Mechanical Alloying of Brittle Materials", Metallurgical Transactions A, vol. 19A, Dec. 1988, pp. 2867-2874.
R. M. Davis, "Mechanical Alloying of Brittle Components", Journal of Metals, Feb. 1987, pp. 60-61.

*Primary Examiner*—Donald P. Walsh
*Assistant Examiner*—Anthony R. Chi
*Attorney, Agent, or Firm*—Daniel P. Morris

[57] ABSTRACT

Methods of fabricating powders of metal particles containing grain growth control additives are described. A powder, metal particles, e.g., copper particles, are mixed with a powder of additive particles, e.g., alumina particles. The mixture is milled in a high energy ball mill to provide metal particles having substantially uniformly distributed therein of additive particles. The ball milled powder contains elongated high aspect ratio particles. The high aspect ratio particles are reduced in size by jet impact milling. The jet impact milled powder can be used to form a conductor forming paste in the fabrication of a metallized ceramic substrate for semiconductor chip packaging application. The jet impact milled powder has particles of sufficiently small in size to fill vias between metallization layers in the green ceramic precursor to the ceramic substrate. During sintering of the combination of ceramic precursor and conductor forming paste, the grain growth control additive results in a substantially void free via filled with metal having a fine grain morphology.

28 Claims, 2 Drawing Sheets

METHOD FOR PRODUCING METAL POWDER WITH A UNIFORM DISTRIBUTION OF DISPERSANTS, METHOD OF USES THEREOF AND STRUCTURES FABRICATED THEREWITH

FIELD OF THE INVENTION

The present invention relates to the methods of fabricating metal containing composite particles including additive particles which are substantially uniformly dispersed within a metal matrix. The dispersants control the growth of grains during sintering of a powder of the metal containing particles to a solid mass. More particularly, the present invention is directed to fabricating multilayer metal ceramic substrate suitable for packaging microelectronic chips wherein the metal patterns are formed from powders of conducting particles containing additives which control the grain growth so that the conductors sinter substantially uniformly with the green ceramic which forms the ceramic material. Most particularly, the metal containing particles comprise copper and an additive which is substantially uniformly dispersed within the copper particles by ball milling and jet impact milling.

BACKGROUND OF THE INVENTION

Advanced high speed semiconductor chips are packaged in modules wherein the chips are physically and electrically mounted on ceramic substrates. The modules can be used as components in an electronic computer. The ceramic substrates contain a plurality of layers, each of which contains a plurality of electrical conductors. Within some of the ceramic layers there are electrically conductive vias electrically interconnecting conductors in adjacent conductive layers. The ceramic layers between the electrical conductors act as electrical insulators. These ceramic substrates are formed by laminating together thin green sheets of glass particles or an admixture of glass and crystalline particles mixed with binders and patterns of paste containing metal particles mixed with binders for forming conductors between the ceramic green sheets and for filling through holes in the green ceramic sheets to form conductive vias between adjacent metallization layers. The green laminate is fired to burn off the binder material, fired to densify the glass particles and metal particles to a dense state, further fired, if necessary, to crystallize the densified glass particles or to further crystallize the admixture of glass and crystalline particles to form an insulator and to coalesce the metal particles to form conductive metal lines and vias.

Ceramic module technology for high end computer packaging uses copper conductors and requires that the sintering and densification of the copper and the ceramic occur at comparable rates over a common co-sintering cycle. Since copper densification rates are usually faster than that of ceramics, a coating of fine alumina particles can be applied to the surface of the copper powder particles by a chemical reduction technique, to retard the kinetics of the copper particle densification to make it comparable to that of the ceramic material. See, for example, U.S. Pat. No. 4,595,181, U.S. Pat. No. 4,600,604 and EPO Patent application 0,272,129 filed Dec. 12, 1987. Due to the small volume fraction of the alumina required, the process involves making a coated powder with large volume and area fraction coverage and mixing this powder with an uncoated powder to achieve the desired average levels of alumina coating. This leads to a problem, in that the coating can be nonuniform and hence result in severe retardation of sintering and densification in some areas and almost no retardation in others. This results in localized shrinkage mismatch between the copper and ceramic material resulting in copper via cracking. An electrical open associated with this cracking can occur in the worse case after complete sintering. A more insidious problem is one where the cracking is only partial after sintering and becomes complete leading to a full electrical open after the module has gone through further processing and chip attachment. Since such modules are generally not reparable they may have to be scrapped. Scrapping a fully fabricated part adds substantially to overall fabrication cost. In addition, a conductive via having a partial fracture could become an open during the operation of the electronic computer containing the module due to crack propagation and hence result in field failures.

The finely deposited alumina particles at the exterior of the copper particles serve to retard shrinkage of the copper during the sintering process of the ceramic. The alumina coating at concentrations typically achievable do not prevent grain growth of the copper during the crystallization temperatures of the ceramic materials typically used to fabricate a semiconductor chip packaging substrate. The result is copper grains which are of the order of 50–100 microns which is of the order of the cross sectional size of vias between the conductive layers in the multi layer ceramic substrate. On cooling, vias which fracture or have the potential for fracture do so by the well known mechanism of intergranular creep fracture. Microvoids, which are the result of vacancy precipitation by low tensile strain rate, accumulate at grain boundaries and may extend across the via. FIG. 1 shows ceramic material 2 having a via 4 therein wherein the via is filled with a copper containing material 6 which is composed of substantially a single grain wherein the grain has a fracture 8 therein and microvoids 10 between the material 6 and the ceramic material 2. The low imposed strain rate is caused by thermal expansion mismatch between the copper and ceramic which results in a relatively large differential size change during cool down from the relatively high sintering temperatures. In some cases large voids formed during sintering may also be found at grain boundaries.

It is an object of the present invention to provide conductive material within a via in a ceramic material wherein the conductive material is formed from grains of electrically conductive material wherein the grain size is substantially uniform and substantially smaller than the size of the via.

Quite surprisingly, applicants have achieved electrically conductive vias having substantially small grain size by providing in metal particles grain growth controlling additives which are substantially uniformly distributed throughout metal particles forming the precursor to the electrically conducting via material. Applicants have achieved this result by a combination of high energy mechanical alloying of the additive with the conducting material and impact jet milling of the mechanically alloyed particles.

These and other object, features and advantage will become more apparent from the following, more detailed description and the drawings and claims appended thereto.

SUMMARY OF THE INVENTION

A broad aspect of the present invention is a method of forming an electrical conductor having a substantially uniform distribution of small grain size conductive particles wherein the grains contain growth control additives.

In a more particular aspect of the method of the present invention, the grain growth control additives are substantially uniformly distributed within electrically conductive particles by high energy ball milling a powder of electrically conductive particles and a powder of the additive.

In another more particular aspect of the method of the present invention, the high energy ball milled powders are jet impact milled to fracture the high energy ball milled particles into small particles.

In a more particular aspect of the method of the present invention, a pattern of an electrical conductor forming composition is formed from a powder of electrically conductive particles containing growth control additives. The pattern is included within a green ceramic body, and simultaneously sintered therewith to form electrical conductors having substantially uniformly distributed grains of small size.

In another more particular aspect of the method of the present invention, the conductor forming composition fills through holes within the green ceramic body and are sintered to substantially crack free and void free electrically conductive vias having substantially uniformly distributed grains having a size substantially smaller than the size of the through hole.

Another broad aspect of the present invention is a ceramic structure having a cavity therein substantially filled with the conductive material having a plurality of substantially uniformly distributed grains of a dimension substantially smaller than the size of the cavity.

In a more particular aspect of the structure of the present invention, the ceramic structure contains a plurality of layers each having a plurality of electrical conductors wherein adjacent levels are interconnected by electrically conductive vias.

In another more particular aspect of the structure of the present invention, an electronic device is mounted in electrical communication with the electrical conductor containing ceramic structure.

DETAILED DESCRIPTION

Figure 1:
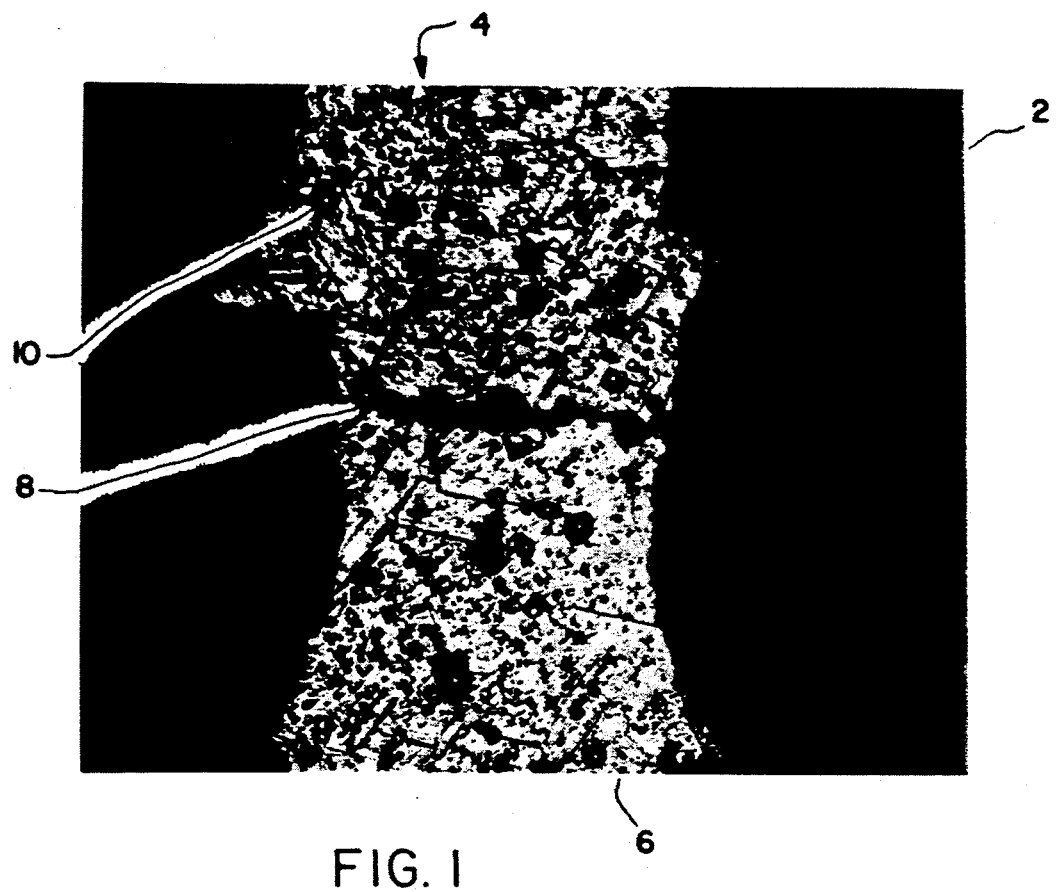
FIG. 1 shows a copper via filling a through hole within a ceramic material. The copper via has grain size substantially on the same order of dimension as the through hole and, in addition, shows a grain boundary crack therein.

As described herein above, the commonly used technique of decorating copper particles with aluminum oxide particles to control copper grain growth does not repeatedly achieve the desired result of small and uniform copper grain size. This is so since copper particles with a uniform distribution of aluminum oxide (alumina) particles cannot be easily achieved.

A solution according to the present invention proposed is a mechanical process to form alloys of disparate materials that are not miscible by normal means of melting and casting. The process involves blending of the materials in a fine powder form and subjecting the mixture to milling in a high energy ball mill. An example of a high energy ball mill is Spex Mixer/Mill manufactured by Spex Industries, Inc. The energy of the impact of the balls leads to both fracture of all the particles as well as rewelding of the fractured components. The net result is the formation of particles that are an intimate mixture of the starting components. High energy ball milling can form intimate mixtures, intermetallic compounds and solid solutions since the mixing can occur at levels extending from atomic to particulate levels. In high energy ball milling stainless steel balls are rolled over the particles to be intermixed at a very rapid rate (e.g. 1,200 rpm). This crushes the particles and intermixes them. When the starting particles are of a malleable material, such as metal particles, for example, copper particles, the high energy ball milled particles are elongated to form flakes having high aspect ratio, for example, in the case of copper from about 10 to about 20. In the case of copper, it has been found that the high energy ball milled flakes are 50–100 $\mu$m in size after mechanical alloying for 2 hours.

It has been found that a substantially uniform dispersion of fine alumina particles can be formed in copper particles by high energy ball milling. The alumina acts to control grain growth by retarding sintering. Examples of other retardants are yittria, thoria, titania and silica. Alumina particles of desired size and quantity can be mixed with copper powder and subjected to high energy milling to achieve intimate mixing. The starting size of the alumina particles is from about 0.05 to about 0.1 $\mu$m. The starting size of the copper particles is from about 2 to about 5 $\mu$m. The weight percent ratio of the alumina particles is from about 0.5 to about 2.0 percent. Cu and alumina do not chemically react at moderately low temperatures. However, depending on the gas ambient in the milling vessel, one can expect oxidation of copper and reaction with alumina under the local heating of the particles at the contact interfaces to form mixed oxide spinels. Examples of gas ambients are $N_2$, Ar and He. The vessel is cooled by water jacket or air impingement. The temperature range of the local heating is from about 50° C. to about 100° C. A mixed oxide spinel is $CuAl_2O_4$ (copper aluminate). The net result would be a uniform distribution of either the alumina or the spinel in the copper matrix. A balance between the welding and breaking apart of the particles is achieved in the mix. This in turn can be used to control the size distribution of the copper particles. Further, one can achieve a wide range of alumina dispersion levels simply by starting out with a blend of pure Cu and heavily dispersed copper powder in a suitable proportion and subjecting the blend to mechanical alloying so that a homogeneous dispersion at the average level (0.5 to 2% by weight) is achieved. This is not possible with the conventional powder blending process (as described in the patents cited above) alone since inhomogeneity in the coating level would persist as has already been described earlier. The final step is to incorporate the mechanically alloyed copper/alumina powder in a screenable paste using standard paste process techniques required for screening as described herein below to fabricate a multilayer ceramic substrate.

The mechanical alloying which can produce a uniform retardant distribution can definitely lead to a uniform retardation of the copper densification rate. In addition, it can also produce a fine inert dispersion of the retardant in the densified copper that can mitigate the creep and cavitation processes that can occur in copper during the cool down cycle of the co-sintering process of the copper paste and green ceramic as described herein below. In effect, the particles can distribute the porosity in the copper uniformly over the entire volume of a via thus preventing the formation of coalesced large voids that can be potential locations for via opens. The pinning effect of the dispersed particles will also lead to a very fine and uniform grain size distribution in the copper that will be stable under the sintering and cool down cycle of the ceramic sintering process as described herein below.

Figure 2:
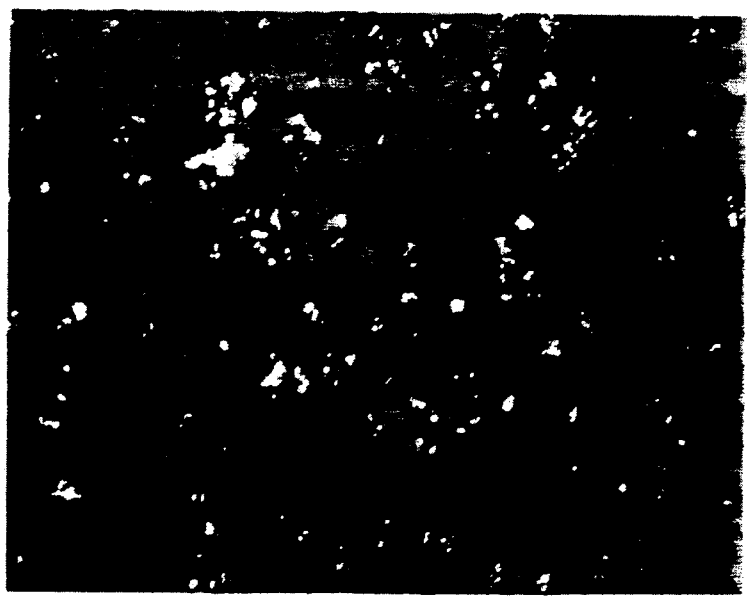
FIG. 2 shows copper powder with a dispersion of aluminum oxide particles prepared by mechanical alloying in air for 2 hours, and ground in alcohol for 2 hours.

Mechanical alloying (MA) is a high energy ball milling process whereby composite powders are synthesized by the repeated cold welding and fracture of an initial powder charge. Ball milling was performed in the Spex Industries 8000 Mixer/Mill using a cylindrical tool steel vessel with stainless steel balls as the milling media. An initial powder charge was a mixture of uncoated Metz copper (10 g) premixed with aluminum oxide powder, 0.05 $\mu$m in size, of 0.05 and 0.2 g, a nominal composition of Cu-0.5% $Al_2O_3$ and Cu-2% $Al_2O_3$ by weight. Initially, the ball milling was carried out only in an air atmosphere up to 4 hour, a dry process. Due to excessive cold welding of the copper powder, the majority of the composite powder produced was larger than the 100 mesh, or a few hundred microns in size. To reduce the average particle size, a grinding experiment was conducted using the same ball mill with a liquid milling media of ethyl alcohol. This additional ball milling reduced the powder size considerably down to 10 or 50 $\mu$m in average. FIG. 2 shows a typical powder size distribution after the two step ball milling, mechanical alloying for 2 hour and grinding in ethyl alcohol for 2 hours. However, the average powder size is still much larger than that of the initial copper powder, 2 to 5 $\mu$m in average. The average particle size was further reduced using a Trost Air Impact Pulverizer which can pulverize the powder particles down to a few microns by using opposing jet streams of fluid energy.

This system is commonly used primarily for the preparation of fine powder of ceramic, pharmaceutical and other brittle materials. Opposing streams of a suitable fluid (usually compressed air or other inert gas such as nitrogen) carrying the material to be pulverized, are made to collide in an impact chamber. The fractured particles are carried upwards by the gas flow which results in the separation of the fine particles from the coarser ones. The coarser particles recirculate through the donor stack back to the impact chamber, thus participating in further fracture due to collisions. The net result is the comminution of coarse particles until their average size distribution reaches a much finer range.

Figure 3:
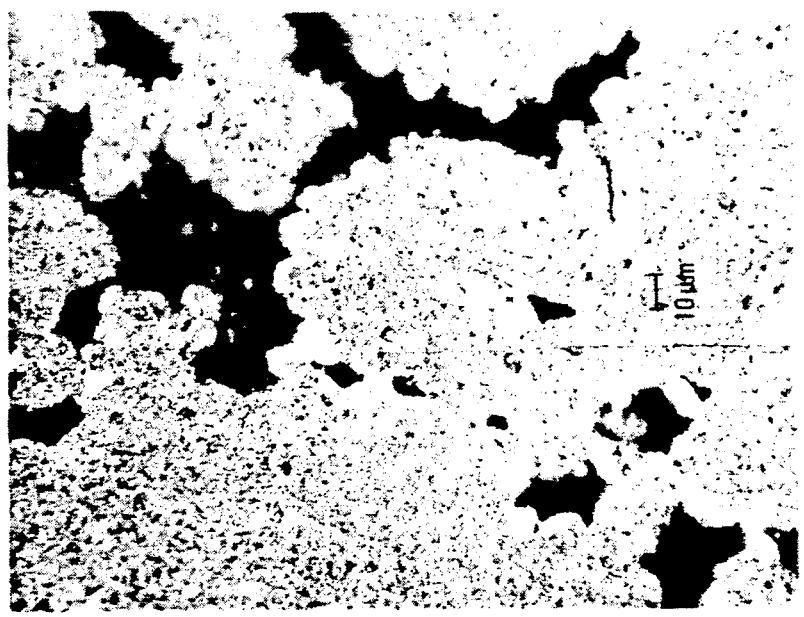
FIG. 3 shows the sintered microstructure of the mechanically alloyed copper powder (without jet impact milling).
Figure 4:
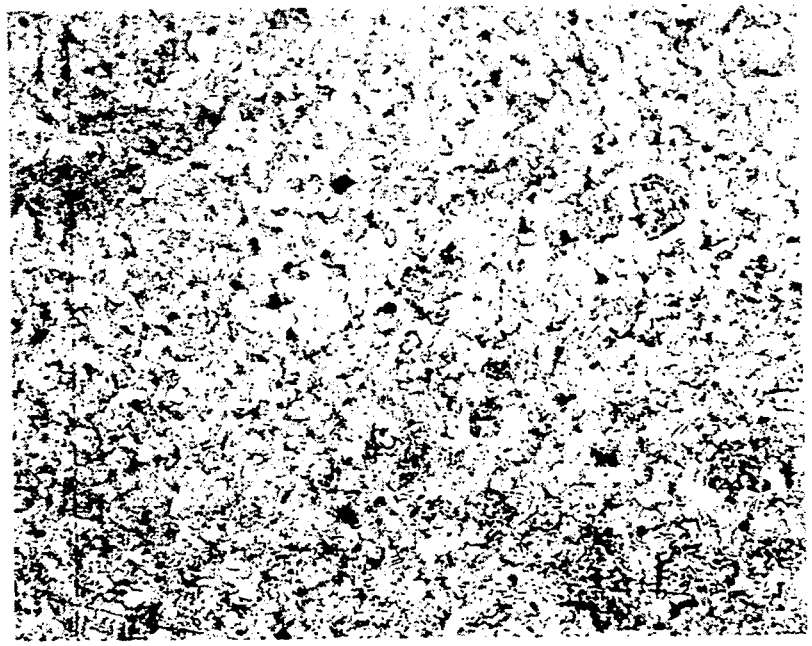
FIG. 4 shows the sintered microstructure of the mechanically alloyed (similar to that shown in FIG. 2) and subsequently impact jet milled copper powder.

To demonstrate the effect of aluminum oxide dispersant on the copper sintering, an initial batch of the powder similar to that shown in FIG. 2 was sintered according to the standard temperature/time schedule of ceramic modules as described herein below. FIG. 3 is a photomicrograph showing a sintered microstructure of the mechanically alloyed copper with aluminum oxide particles. Since the aluminum oxide particles are very fine, about 0.05 $\mu$m in average, their direct resolution in an optical microscope was not possible. However, the etched microstructure of the copper matrix exhibited a grain size of a few microns, which is much finer than that observed in the sintered copper without the mechanical alloying, about a few hundred microns in average. In FIG. 3, many interparticle porosites are visible, which are due to the initial MA (mechanically alloyed) powder of a large particle size. These porosites disappear when the MA (mechanically alloyed) powder is further reduced in size by the pulverizing technique mentioned above and then sintered as shown in FIG. 4.

The invention described herein is not restricted to the blending of copper and alumina powders alone. One can envision other applications where composite powder materials may be required wherein the components may consist of dissimilar materials that may have to be mixed to achieve a desired property in a manner that leads to homogeneity of the property down to a microscopic level. Some examples are, mixtures of metal and ceramic powders to achieve optimum balance between thermal expansion coefficient (TCE) and electrical conductivity, mixtures of ceramic powders to achieve optimum TCE and fracture toughness, flexural strength and the like.

After the grain growth control additive has been uniformly distributed in the conductive particles a paste can be formed by mixing the particles with a binder material as described herein below. The paste can be readily used in the screening and sintering process to achieve the controlled sintering procedure in the fabrication of a multilayer ceramic (MLC) substrate. Similar implementations can be achieved for the other general applications cited above as long as the process involves the use of screening of pastes and their sintering to achieve densified composites. Direct powder metallurgical sintering with or without isostatic pressure can be employed if the desired result is a structural component of a particular shape and geometry.

In a preferred embodiment the electrical conductors having grain growth control additives according to the present invention are used for electrically conductive lines and vias in a multilayer ceramic substrate on which a semiconductor chip is mounted. The process of fabricating such a substrate will be described first and the details on fabricating the powders will now be discussed.

Multi-layered ceramic circuit substrates contain patterned metal layers which act as electrical conductors sandwiched between ceramic layer which act as electrical insulators. These ceramic substrates are formed by laminating together thin green sheets of glass particles or an admixture of glass and crystalline particles mixed with binders and patterns of paste containing metal particles mixed with binder for forming conductors between the ceramic green sheet. This green laminate is fired to burn off the binder materials, fired to coalesce the particles to a dense state, further fired if necessary to crystallize the densified glass particles or to further crystallize the admixture of glass and crystalline particles to form an insulator and to coalesce the metal particles to form conducting metal lines.

Terms such as ceramic and glass ceramic are often used interchangeably in the art. To avoid confusion for the purpose of this application the following definitions will be used. The term ceramic has the following meaning: an aggregate of randomly oriented crystallites wherein the interstices between crystallites optionally contain uncrystallized material such as a glass. The terms coalescence or densification refer to a heat treatment to reduce the density of pores in green sheets. The term crystallization refers to further heating after coalescence or densification or heating if there is no coalescence or densification step, to form crystallites from a glass. The term sintering refers to the heat treatment required to form the final ceramic. Sintering of a green sheet of crystallizable glass particles is a heat treatment to coalesce or densify the green sheet plus the heat treatment to form crystallites from the glass. Sintering of a green sheet of an admixture of glass particles and crystalline particles is a heat treatment to coalesce or densify the green sheet plus a crystallizing heat treatment only if further crystallization is required. The term sintering temperature means, for a green sheet requiring crystallization, the crystallization temperature. The term sintering temperature means, for a green sheet not requiring crystallization, the coalescence temperature. The term firing means all heat treatments needed to form a ceramic body and electrical conductors therein.

Substrates made of ceramics requiring high temperatures for particle coalescence and densification such as alumina, restrict the choice of co-sinterable conducting metallurgies to high melting point metals, for example, refractory metals, such as molybdenum, tungsten, platinum, palladium or a combination of these with each other or certain other metals and precludes the use of good electrical conductors such as gold, silver and copper which have melting points less than the alumina sintering temperature. Alumina is a good insulator, has high thermal conductivity and has good strength. However, it is disadvantageous with respect to its dielectric constant and its thermal coefficients of expansion. The relatively high dielectric constant of alumina, about 10, results in unacceptable electrical signal delays since the pulse propagation speed on the transmission line formed by metal conductor embedded in the dielctric material of the substrate is inversely proportional to the square root of the material dielectric constant. The higher thermal coefficient of expansion of alumina, compared to silicon, results in shear stress in the solder joints electrically and mechanically connecting device and circuit elements on the chip to the substrate.

The material often referred to as glass-ceramic has been intensively studied in recent years for use as circuit substrates. These ceramics generally have a low dielectric constant, a low thermal coefficient of expansion which is close in value to silicon and a low sintering temperature. The low sintering temperature permits the use of low melting point metals, such as copper and noble metals, for electrical conductors. Noble metals have low resistivities comparable to copper. However, copper is less expensive and therefore its use substantially reduces manufacturing cost. When copper is used as the electrical conductor, it is necessary that thermoplastic organic binder materials contained within the green sheet used to form the ceramic and contained within the paste used to form the copper conductors be burned out in an atmosphere and at a temperature wherein the copper is not substantially oxidized.

Two references, the teachings of which are incorporated herein by reference, generally describing binder burn-out and the fabrication of ceramics are U.S. Pat. No. 4,234,367 to Herron et al. and U.S. Pat. No. 4,504,339 to Kamehara et al.

A ceramic composite structure formed by the method of the present invention is useful as a substrate on which a semiconductor chip is mounted to provide electrical connection of device and circuit elements on such semiconductor chip to a support structure, such as a printed circuit board to which the substrate is electrically connected.

An object of this invention is to provide a process of manufacturing ceramic materials suitable for packaging of electronic circuits at a temperature compatible with the metallization used to provide electrical circuit conductors. It is important that the process be performed at a temperature below the melting or sintering temperature of the metallization, such as copper, formed on or within the ceramic material. The melting point of copper is about 1083° C. If the metallization is heated excessively, it melts, disperses, or acts as a flux to the glass or melts to form a puddle on the ceramic material. If the metallization is damaged, the electrical circuits in the integrated circuit structure are destroyed, thereby destroying the value of the package. It is a prerequisite in the art of electronic circuit packaging that the ceramic materials be processed at lower temperatures compatible with preserving the metallization structures on the packages. Metals for use in packages include but is not limited to Ag, Au and Cu.

The composite structure is formed from at least one green sheet, comprised of a thermoplastic organic binder having dispersed within the binder particles of a crystallizable glass or an admixture of glass particles and crystalline particles. Commonly used ceramic binders are Butvar (registered trademark of Monsanto Inc.), poly(vinyl butyral) and poly(vinyl acetate), poly(methyl methacrylate) and cellusolve acetate. Such binders are exemplary only and not limiting. The sintering temperature of the green sheet is less than the melting point of the copper-based metallurgy which forms conductors within the composite structures. The sintering temperature of a green sheet composed of crystallizable glass particles is the crystallization temperature. The sintering temperature of an admixture of glass and crystalline particles is the coalescence temperature if no further crystallization is required or the crystallization temperature if further crystallization is required.

Examples of crystallizable glasses, useful for practicing the present invention, are disclosed in U.S. Pat. No. 4,301,324 to Kumar et al. and the process for making such ceramic structure is disclosed in U.S. Pat. No. 4,413,061 to Kumar et al. The teachings of both patents are incorporated herein by reference. The disclosed ceramic structures are characterized with low dielectric constants and are compatible with circuitry of copper-based metallurgy co-sinterable therewith. These glasses have crystallization temperature in the range of about 850° C. to 970° C.

Of the two types of ceramics disclosed in the aforesaid U.S. Pat. Nos. 4,301,324 and 4,413,061, one has spodumene, $Li_2O-Al_2O_3-4SiO_2$, as the principal crystalline phase while the other has cordierite, $2MgO-2Al_2O_3 5SiO_2$, as the principal crystalline phase. A common feature of these sintered ceramics, among others, is their excellent sinterability and crystallization below 1000° C.

The terms spodumene glass and cordierite glass as used herein refer to the uncoalesced and uncrystallized glass particles. The terms spodumene ceramic and cordierite ceramic as used herein refer to the coalesced and crystallized ceramic.

The multi-layered ceramic of the present invention includes, but is not limited to, the spodumene ceramics and cordierite ceramics as described in the Kumar et al. patents.

Examples of crystalline particles useful to form an admixture of glass and crystalline particles from which a ceramic can be formed include but are not limited to cordierite, spodumene, eucriptite, borosilicate glass, lead glass, enstatite, celsian, wollastonite, willemite, anorthite, lithium disilicate, lithium metasilicate, mullite, aluminum nitride combinations thereof and combinations thereof with alumina.

The following is a list of the general formula for the predominant components of the materials mentioned above:

celsian, $BaO.Al_2O_3.2SiO_2$
anothite, $CuO.Al_2O_3.2SiO_2$
lithium disilcate, $Li_2O_6.2SiO_2$
lithium metasilicate, $Li_2O.SiO_2$
wallastinite, $CaO.SiO_2$
willemite, $2ZnO.S_iO_2$
eucriptite, $Li_2O.Al_2O_3.2SiO_2$
mullite, $3Al_2O_3.2SiO_2$
enstatite, $MgO.SiO_2$ The term glass ceramic means an aggregate of randomly oriented crystallites, for example, the material listed above, wherein the intersticies between crystallites may contain uncrystallized material such as glass, for example the precursor of the above listed materials.

For convenience the invention will be described with reference to a cordierite glass ceramic containing copper conductors. However, the invention is not limited thereto.

The glass particles contained in the admixture can be any glass, such as for example borosilicate glass, and lead glass which will coalesce to a dense state to encapsulate the crystalline particles.

On the surface of the green sheet is deposited a pattern of a copper-based conductor forming composition which includes a copper paste binder, for example ethylcellulose.

A second green sheet is superimposed on the first sheet to sandwich the conductor pattern therebetween. The sheets are laminated together. A multi-layered ceramic structure is formed by laminating green sheets alternately with patterns of copper-based paste between green sheets. Copper patterns separated by glass sheets are connected by through-holes or vias in the green sheets which are filled with the copper-based paste. For a ceramic structure for use as a semiconductor chip substrate, the copper pattern is extended to at least one surface of the composite structure.

Examples of illustrations of ceramics used for the preferred embodiment of this invention are the spodumene and cordierite glass formulations disclosed in the aforesaid patents to Kumar et al. The crystallization temperatures of these ceramics are in the range of about 850° C. to about 970° C. In a second firing step the laminated multi-layered glass structure is heated preferably at a rate of about 1° C. to 5° C. per minute in a reducing or neutral atmosphere to the sintering temperature.

A fired composite structure of laminated multi-layer ceramic layers with metal planes therein for use as a circuit substrate has the metal pattern extended to at least one surface of the fired laminate. An integrated circuit semiconductor chip is mounted on the laminate in electrical connection with the metal extensions.

Alternatively, on the ceramic surface to which the metal patterns extend a polymer body containing electrical conductors can be disposed. These conductors are electrically connected to the ceramic structure conductors and extend to a surface of the polymer body to which an electronic device, e.g., a semiconductor chip is electrically connected as described in U.S. application Ser. No. 07/695,368, filed May 3, 1991, the teaching of which is incorporated herein by reference.

EXAMPLE

The multi-layered substrate fabrication process involves the following illustrative basic steps.

Step 1

The cullet of the chosen crystallizable glass is a cordierite type glass disclosed in U.S. Pat. No. 4,301,324 to Kumar et al. is ground to average particle sizes in the range of 2 to 7 micrometers. The grinding can be done in two steps, a preliminary dry or wet grinding to 400 mesh particle size followed by further grinding with suitable organic binders and solvents until the average particle size is reduced to lie between 2 to 7 micrometers and a castable slurry or slip is obtained. A single stage prolonged grinding of the cullet in the medium of the binder and solvent, until the desired particles sizes are obtained can be used. In the latter case, a filtering step may be necessary to remove over-sized particles.

By way of example, a suitable binder is polyvinylbutyral resin with a plasticizer such as dipropylglycoldibenzoate (e.g. the commercial Benzoflex plasticizer of the Tennessee Products and Chemical Corp). Other suitable polymers are polyvinyl acetate, selected ones of the acrylic resins, and the like. Similarly other suitable plasticizers such as dioctylphthalate, dibutyl phthalate, and the like, can also be used.

The purpose of adding an easily evaporable solvent is (1) to initially dissolve the binder so as to enable it to coat the individual glass particles, and (2) to adjust the rheology of the slip or slurry for good castability. A particularly effective solvent for the purpose of this example are the dual solvent systems of U.S. Pat. No. 4,104,245, specifically the dual methanol/-methyl isobutylketone (in a § weight ratio) solvent system.

Step 2

The slip or slurry prepared as in Step 1 is cast, in accordance with conventional techniques, into thin green sheets (e.g. about 750-250 micrometers (3–10 mils) thick), preferably by doctor-blading techniques.

Step 3

The cast sheets are blanked to the required dimensions and via holes are punched through them in the required configuration.

Step 4

A metallizing paste of copper is extruded or screened into the via holes in the individual sheets.

Step 5

A suitable copper paste or ink is then screen-printed onto the individual green sheets of Step 4, in the required conductor patterns.

Step 6

A plurality of sheets, prepared as in Step 5, are laminated together in registry in a laminating press;

The temperature and pressure employed for lamination should be such as to cause (1) the individual green sheets to bond to each other to yield a monolithic green substrate, and (2) to cause the green sheet to sufficiently flow and enclose the conductor patterns.

Step 7

Firing of the laminate to the sintering temperatures to accomplish binder removal, densification or coalescence of the glass particles, and conversions to a glass-ceramic by crystallization with concurrent sintering of the metal particles, in the conductor patterns, the dense copper lines and vias.

A typical firing schedule is as follows. The green laminate is heated at a rate of 30° C./min. in air to hold temperature of 250° C. The laminate is held at this temperature for about one hour. The air ambient is switched to a forming gas ($N_2$, $H_2$ mix) ambient at which point the heating is again elevated at a rate of 3.8° C./min. to the crystallization temperature of the glass (e.g. about 960° C. for the glass), which temperature is held for about 2 hours, after which the temperature is reduced to ambient at a rate of about 3.8° C./min.

While the invention has been illustrated and described with respect to preferred embodiments, it is to be understood that the invention is not limited to the precise constructions herein disclosed, and the right is reserved to all changes and modifications coming within the scope of the invention as defined in the appended claims.

We claim:

1. A method of forming a powder of particles containing a substantially uniform distribution of an additive therein comprising:
   providing a first powder of particles;
   providing a second powder of said additive particles;
   ball milling an admixture of said first powder and said second powder to provide ball milled particles;
   jet impact milling said ball milled admixtures to form said powder of said particles containing said substantially uniform distribution of said additive therein.

2. The method of claim 1, wherein said ball milling is high energy ball milling.

3. The method of claim 1, wherein said additive is a grain growth control additive.

4. The method of claim 1, wherein said jet impact milling comprises:
   providing a first and second stream of said ball milled particle admixture;
   directing said first stream at said second stream so that particles in said first stream collide with particles in said second stream.

5. The method of claim 4, wherein said jet impact milling fractures said ball milled particles.

6. The method of claim 1, wherein said first powder of particles is a powder of metal particles.

7. The method of claim 1, wherein said additives are particles selected from the group consisting of particles of alumina, yttria, thoria, titania or other refractory metal oxides.

8. The method of claim 1, wherein said particles of said first powder have a size from about 2 microns to about 5 microns.

9. The method of claim 1, wherein said additive particles have a size from about 0.05 microns to about 0.1 microns.

10. The method of claim 1, wherein said admixture of said first powder and said second powder further includes a solvent.

11. The method of claim 10, wherein said solvent is selected from the group consisting of ethyl alcohol or methyl alcohol.

12. The method of claim 1, wherein said powder of particles is an electrical conductor forming composition.

13. The method of claim 1, further including screening said powder to screen out particles of preselected size.

14. The method of claim 6, wherein said metal particles are copper particles.

15. The method of claim 12, further comprising:
   forming at least one green sheet comprised of a binder having dispersed therein particles selected from the group consisting of particles of glass and an admixture of glass particles and crystalline particles, said green sheet having a sintering temperature below the melting point of said electrical conductors;
   forming on a surface of said first green sheet a pattern of said conductor forming composition,
   superimposing a second said sheet on said surface of said first sheet to sandwich said pattern therebetween;
   laminating said superimposed sheets together to form a laminate;
   heating said laminate to a burn-out temperature and maintaining said laminate thereat for sufficient time to decompose and eliminate said binder; and
   sintering said laminate to form a ceramic structure having electrical conductors extending within the interior thereof.

16. The method of claim 15, wherein said burn-out temperature is from about 160° C. to about 450° C.

17. The method of claim 15, where said crystalline particles are selected from the group consisting of cordierite, spodument, eucryptite, enstatite, celsian, wollastinite, willemite, anorthite, lithium disilicate, lithium metasilicate, mullite, aluminum nitride, alumina and combinations thereof.

18. The method of claim 15, wherein said glass is selected from the group consisting of borosilicate glass, lead glass and precursors to cordierite, spodumene, eucryptite, enstatite, celsian, wollastinite, willemite, anorthite, lithium disilicate, lithium metasilicate, mullite, aluminum nitride, alumina and combinations thereof.

19. The method of claim 15, including providing means for extending said pattern to at least one surface of said laminate.

20. The method of claim 15, wherein said laminate is sintered in a reducing or inert atmosphere.

21. The method of claim 18, including mounting an integrated semiconductor chip on said surface in electrical connection to a portion of said pattern extension.

22. The method of claim 15, wherein said conductor forming composition further includes a binder.

23. The method of claim 15, wherein said glass is selected from the group consisting of crystallizable glass and uncrystallizable glass.

24. The method of claim 12, further comprising:
   forming a body of a green precursor to a ceramic material;
   said body containing patterns of said electrical conductor forming composition;

firing said body to form a ceramic containing electrical conductors therein.

25. The method of claim 1, wherein said additive particles control thermal coefficient of expansion.

26. The method of claim 1, wherein said additive particles control electrical conductivity.

27. The method of claim 1, wherein said additive particles control fracture toughness.

28. The method of claim 1, wherein said additive particles control flexural strength.

* * * * *